United States Patent
Hara et al.

(10) Patent No.: US 11,145,679 B2
(45) Date of Patent: Oct. 12, 2021

(54) METHOD FOR MANUFACTURING ACTIVE MATRIX BOARD

(71) Applicant: Sharp Kabushiki Kaisha, Sakai (JP)

(72) Inventors: Kengo Hara, Sakai (JP); Tohru Daitoh, Sakai (JP); Hajime Imai, Sakai (JP); Tetsuo Kikuchi, Sakai (JP); Masahiko Suzuki, Sakai (JP); Setsuji Nishimiya, Sakai (JP); Masamitsu Yamanaka, Sakai (JP); Teruyuki Ueda, Sakai (JP); Hitoshi Takahata, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/820,900

(22) Filed: Mar. 17, 2020

(65) Prior Publication Data
US 2020/0303425 A1    Sep. 24, 2020

Related U.S. Application Data

(60) Provisional application No. 62/822,192, filed on Mar. 22, 2019.

(51) Int. Cl.
*H01L 27/12* (2006.01)
*H01L 21/02* (2006.01)
(Continued)

(52) U.S. Cl.
CPC ........ *H01L 27/1225* (2013.01); *G02F 1/1368* (2013.01); *G02F 1/13439* (2013.01); *G02F 1/133345* (2013.01); *G02F 1/134309* (2013.01); *G02F 1/136209* (2013.01); *H01L 21/02565* (2013.01); *H01L 21/02631* (2013.01); *H01L 27/124* (2013.01); *H01L 27/127* (2013.01); *H01L 27/1288* (2013.01);
(Continued)

(58) Field of Classification Search
CPC .......... H01L 27/1225; H01L 21/02565; H01L 21/02631; H01L 27/124; G02F 1/133345; G02F 1/134309; G02F 1/13439; G02F 1/136209; G02F 1/1368
USPC ........................................................ 438/104
See application file for complete search history.

(56) References Cited

U.S. PATENT DOCUMENTS

| 2012/0138922 A1 | 6/2012 | Yamazaki et al. |
| 2012/0241733 A1 | 9/2012 | Morooka et al. |

FOREIGN PATENT DOCUMENTS

| JP | 2012-134475 A | 7/2012 |
| JP | 2012-204077 A | 10/2012 |
| WO | 2018/212100 A1 | 11/2018 |

*Primary Examiner* — Ori Nadav
(74) *Attorney, Agent, or Firm* — Keating & Bennett, LLP

(57) ABSTRACT

A method for manufacturing an active matrix board includes (E) a step of forming a source contact hole and a drain contact hole in an interlayer insulating layer such that a portion of a source contact region of an oxide semiconductor layer and a portion of a drain contact region thereof are exposed and forming a connecting portion contact hole in the interlayer insulating layer and a lower insulating layer such that a portion of a lower conductive layer is exposed; and (F) a step of forming a source electrode, a drain electrode, and an upper conductive layer on the interlayer insulating layer; and the step (E) includes (e-1) a step of forming a photoresist film on the interlayer insulating layer and (e-2) a step of forming a photoresist layer in such a manner that the photoresist film is exposed to light using a multi-tone mask and is then developed.

7 Claims, 14 Drawing Sheets

(51) Int. Cl.
*H01L 29/66* (2006.01)
*H01L 29/24* (2006.01)
*H01L 29/786* (2006.01)
*G02F 1/1368* (2006.01)
*G02F 1/1343* (2006.01)
*G02F 1/1362* (2006.01)
*G02F 1/1333* (2006.01)

(52) U.S. Cl.
CPC ........ *H01L 29/24* (2013.01); *H01L 29/66969* (2013.01); *H01L 29/7869* (2013.01); *H01L 29/78633* (2013.01); *G02F 1/134372* (2021.01); *G02F 2201/121* (2013.01); *G02F 2201/123* (2013.01)

METHOD FOR MANUFACTURING ACTIVE MATRIX BOARD

TECHNICAL FIELD

The disclosure relates to methods for manufacturing active matrix boards and particularly relates to a method for manufacturing an active matrix board including an oxide semiconductor TFT.

BACKGROUND ART

At present, display apparatuses including active matrix boards provided with a switching element for each pixel are widely used. An active matrix board including thin-film transistors (hereinafter referred to as "TFTs") as switching elements is referred to as a TFT board. Incidentally, in the present specification, a TFT placed in each pixel in an active matrix board as a switching element, is referred to as a "pixel TFT" in some cases.

In recent years, it has been proposed that an oxide semiconductor is used as material for active layers of TFTs instead of amorphous silicon or polycrystalline silicon. A TFT including an oxide semiconductor film as an active layer is referred to as an "oxide semiconductor TFT". Patent Literature 1 discloses an active matrix board in which In—Ga—Zn—O semiconductor films are used as active layers of TFTs.

Oxide semiconductors have mobility higher than that of amorphous silicon. Therefore, oxide semiconductor TFTs can operate faster than amorphous silicon TFTs. Furthermore, oxide semiconductor films are formed by a simpler process as compared to polycrystalline silicon films and therefore can be applied to apparatuses demanding a large area.

The structure of TFTs is roughly classified into a bottom-gate structure and a top-gate structure. At present, the bottom-gate structure is often used in oxide semiconductor TFTs. However, using the top-gate structure has been proposed (for example, Patent Literature 2). In the top-gate structure, a gate insulating layer can be thinned and therefore high current supply ability is obtained. Incidentally, in the present specification, a gate electrode in the bottom-gate structure is referred to as a "lower gate electrode" and a gate electrode in the top-gate structure is referred to as an "upper gate electrode".

In liquid crystal display apparatuses, for the purpose of narrowing a frame of a liquid crystal panel and for the purpose of reducing the number of mounted driver ICs, gate drivers and SSD (source shared driving) circuits are formed monolithically with active matrix boards in some cases. A gate driver formed monolithically with an active matrix board is referred to as a GDM circuit in some cases. In an active matrix board including a GDM circuit or SSD circuit formed monolithically therewith, a TFT needs to charge a large capacitor (bus line capacitor) and therefore it can be said that the TFT preferably has the top-gate structure. From the viewpoint that space saving is possible for the purpose of narrowing a frame, it can be said that the top-gate structure is preferable.

In TFTs with the top-gate structure, the following configuration is known: a configuration in which a channel light-shielding layer is placed under a channel region of a semiconductor layer for the purpose of inhibiting the occurrence of a leakage current due to the application of light to the semiconductor layer. Recently, an oxide semiconductor TFT with a double-gate structure including both a lower gate electrode and an upper gate electrode has been proposed. In the case of the double-gate structure, the lower gate electrode can function as a channel light-shielding layer.

Patent Literature 3 discloses an active matrix board, including an oxide semiconductor TFT including an upper gate electrode (that is, having a top-gate structure or a double-gate structure), for use in FSS-mode liquid crystal display apparatuses. In a process for manufacturing this active matrix board, a photolithographic step is performed nine times. That is, nine photomasks are used. In the present specification, a process demanding such nine photomasks is referred to as a "nine-mask process".

CITATION LIST

Patent Literature

[PTL 1] Japanese Unexamined Patent Application Publication No. 2012-134475
[PTL 2] Japanese Unexamined Patent Application Publication No. 2012-204077
[PTL 3] International Publication No. 2018/212100

SUMMARY

Technical Problem

In an active matrix board manufactured by a nine-mask process, the inventor has investigated the use of a configuration in which, in each pixel of a display region, an oxide semiconductor layer and a source/drain electrode are brought into contact with each other in a contact hole formed in an interlayer insulating layer and, in a peripheral region, a conductive layer (referred to as a "lower conductive layer") formed from the same conductive film as a channel light-shielding layer (or a lower gate electrode) and a conductive layer (referred to as an "upper conductive layer") formed from the same conductive film as the source/drain electrode are brought into contact with each other in a contact hole formed in both the interlayer insulating layer and a lower insulating layer.

However, in this configuration, since the lower insulating layer and the interlayer insulating layer are collectively etched as described below, the etching time is long. Therefore, the size of the contact holes is large, leading to difficulty in design. In each pixel, the oxide semiconductor layer functions as an etching stopper for the lower insulating layer. When the oxide semiconductor layer is not sufficient to withstand etching, the lower insulating layer is etched.

The disclosure has been made in view of the above problem and it is an object of the disclosure to provide a method successfully used to manufacture an active matrix board including an oxide semiconductor TFT including an upper gate electrode and a channel light-shielding layer.

Solution to Problem

The present specification discloses a method for manufacturing an active matrix board specified in items below.
[Item 1]
A method for manufacturing an active matrix board including
a display region including a plurality of pixel regions, a peripheral region located around the display region,
a substrate, and oxide semiconductor TFTs which are supported with the substrate and each of which is placed in a corresponding one of the pixel regions, each of the pixel regions including a light-shielding layer which is placed on the substrate and which has conductivity;

a lower insulating layer covering the light-shielding layer;

an oxide semiconductor layer which is placed on the lower insulating layer, which includes a channel region overlapping the light-shielding layer when viewed in a substrate surface normal direction, and which also includes a source contact region and drain contact region located on both sides of the oxide semiconductor layer;

a gate insulating layer placed on the channel region of the oxide semiconductor layer;

a gate electrode placed on the gate insulating layer;

an interlayer insulating layer covering the gate electrode and the oxide semiconductor layer;

a source electrode; and a drain electrode, the source electrode and the drain electrode being connected to the source contact region and the drain contact region, respectively, in a source contact hole and drain contact hole, respectively, formed in the interlayer insulating layer, the peripheral region including a lower conductive layer formed from the same conductive film as the light-shielding layer and an upper conductive layer formed from the same conductive film as the source electrode and the drain electrode, the upper conductive layer being connected to the lower conductive layer in a connecting portion contact hole formed in the interlayer insulating layer and the lower insulating layer, includes (A) a step of forming the light-shielding layer and the lower conductive layer on the substrate;

(B) a step of forming the lower insulating layer such that the lower insulating layer covers the light-shielding layer and the lower conductive layer;

(C) a step of forming the oxide semiconductor layer, the gate insulating layer, and the gate electrode on the lower insulating layer;

(D) a step of forming the interlayer insulating layer such that the interlayer insulating layer covers the gate electrode and the oxide semiconductor layer;

(E) a step of forming the source contact hole and the drain contact hole in the interlayer insulating layer such that a portion of the source contact region of the oxide semiconductor layer and a portion of the drain contact region thereof are exposed and forming the connecting portion contact hole in the interlayer insulating layer and the lower insulating layer such that a portion of the lower conductive layer is exposed; and (F) a step of forming the source electrode, the drain electrode, and the upper conductive layer on the interlayer insulating layer, the step (E) including (e-1) a step of forming a photoresist film on the interlayer insulating layer and (e-2) a step of forming a photoresist layer in such a manner that the photoresist film is exposed to light using a multi-tone mask and is then developed, the photoresist layer including a first region having a first thickness, a second region which has a second thickness less than the first thickness and which overlaps a portion of the source contact region, a third region which has the second thickness and which overlaps a portion of the drain contact region, and a first opening portion overlapping the portion of the lower conductive layer.

[Item 2]

In the method for manufacturing the active matrix board specified in Item 1, the step (E) further includes (e-3) a step of forming a first hole in the interlayer insulating layer by etching after the step (e-2) such that the first hole extends from the first opening portion in the photoresist layer, (e-4) a step of forming a second opening portion and a third opening portion in the photoresist layer by removing the second region and the third region, respectively, from the photoresist layer after the step (e-3), and (e-5) a step of forming a second hole in the lower insulating layer by etching after the step (e-4) such that the second hole extends from the first hole in the interlayer insulating layer and forming a third hole and a fourth hole in the interlayer insulating layer by etching such that the third hole and the fourth hole extend from the second opening portion and the third opening portion, respectively, in the photoresist layer.

[Item 3]

In the method for manufacturing the active matrix board specified in Item 1, the step (E) further includes (e-3) a step of forming a first hole in the interlayer insulating layer and the lower insulating layer by etching after the step (e-2) such that the first hole extends from the first opening portion in the photoresist layer, (e-4) a step of forming a second opening portion and a third opening portion in the photoresist layer by removing the second region and the third region, respectively, from the photoresist layer after the step (e-3), and (e-5) a step of forming a second hole and a third hole in the interlayer insulating layer by etching after the step (e-4) such that the second hole and the third hole extend from the second opening portion and the third opening portion, respectively, in the photoresist layer.

[Item 4]

In the method for manufacturing the active matrix board specified in Item 2 or 3, the step (e-4) is performed by ashing.

[Item 5]

In the method for manufacturing the active matrix board specified in any one of Items 1 to 4, the light-shielding layer is supplied with substantially the same potential as that of the gate electrode.

[Item 6]

In the method for manufacturing the active matrix board specified in any one of Items 1 to 5, the oxide semiconductor layer contains an In—Ga—Zn—O semiconductor.

[Item 7]

In the method for manufacturing the active matrix board specified in Item 6, wherein the In—Ga—Zn—O semiconductor includes a crystalline portion.

Advantageous Effects of Invention

According to an embodiment of the disclosure, the following method can be provided: a method successfully used to manufacture an active matrix board including an oxide semiconductor TFT including an upper gate electrode and a channel light-shielding layer.

DESCRIPTION OF EMBODIMENTS

Methods for manufacturing active matrix boards according to embodiments of the disclosure are described below with reference to drawings. An active matrix board with which a gate driver is formed monolithically and in which a source driver is mounted is described below as an example. Embodiments of the disclosure are not limited to this.

Embodiment 1

Figure 1:
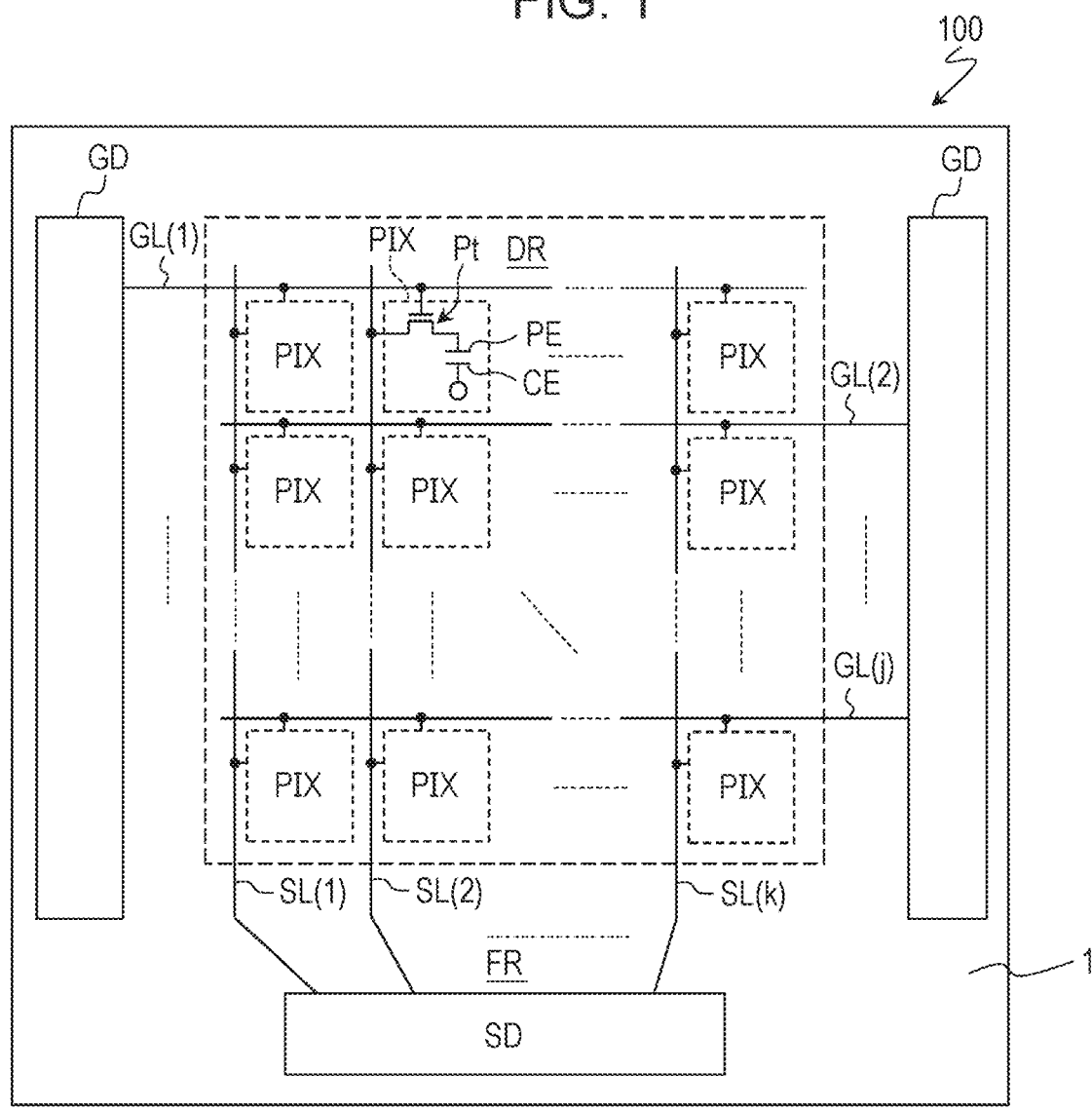
FIG. 1 is a schematic view showing an example of the planar structure of an active matrix board that can be manufactured by a manufacturing method according to an embodiment 1 of the disclosure.

First, the structure of an active matrix board 100 that can be manufactured by a manufacturing method according to an embodiment 1 is outlined with reference to FIG. 1. FIG. 1 is a schematic view showing an example of the planar structure of the active matrix board 100.

As shown in FIG. 1, the active matrix board 100 includes a display region DR and a peripheral region (also referred to as a "frame region" in some cases) FR. The display region DR includes a plurality of pixel regions PIX arranged in a matrix pattern. The pixel regions (simply referred to as "pixels" in some cases) PIX are regions corresponding to pixels of a display apparatus. The peripheral region FR is located around the display region DR.

The display region DR is provided with a plurality of gate bus lines GL(1) to GL(j) (j is an integer of 2 or more, hereinafter collectively referred to as "gate bus lines GL") extending in an x-direction (row direction) and a plurality of source bus lines SL(1) to SL(k) (k is an integer of 2 or more, hereinafter collectively referred to as "source bus lines SL") extending in a y-direction (column direction). The pixel regions PIX are defined by, for example, the gate bus lines GL and the source bus lines SL. Each of the gate bus lines GL is connected to a corresponding one of terminals of gate drivers GD. Each of the source bus lines SL is connected to a corresponding one of terminals of a source driver SD.

The active matrix board 100 includes a substrate 1 and pixel TFTs Pt which are supported with the substrate 1 and each of which is placed in a corresponding one of the pixel regions PIX. The pixel TFTs Pt are oxide semiconductor TFTs including an oxide semiconductor layer as an active layer.

The pixel regions PIX each include a pixel electrode PE in addition to the above-mentioned pixel TFTs Pt. A gate electrode of each of the pixel TFTs Pt is electrically connected to a corresponding one of the gate bus lines GL. A source electrode of each of the pixel TFTs Pt is electrically connected to a corresponding one of the source bus lines SL. A drain electrode of each of the pixel TFTs Pt is electrically connected to a corresponding one of the pixel electrodes PE. In a case where the active matrix board 100 is used in a liquid crystal display apparatus of a transverse electric field mode such as an FFS (fringe field switching) mode, the active matrix board 100 is provided with an electrode (common electrode) CE common to a plurality of pixels.

In the peripheral region FR, the gate drivers GD are integrally (monolithically) placed so as to drive the gate bus lines GL. In the peripheral region FR, peripheral circuits, such as source shared driving (SSD) circuits, driving the source bus lines SL in a time-sharing mode may be integrally placed, which is not shown.

The detailed structure of the pixel regions PIX in the active matrix board 100 are described below.

Figure 2:
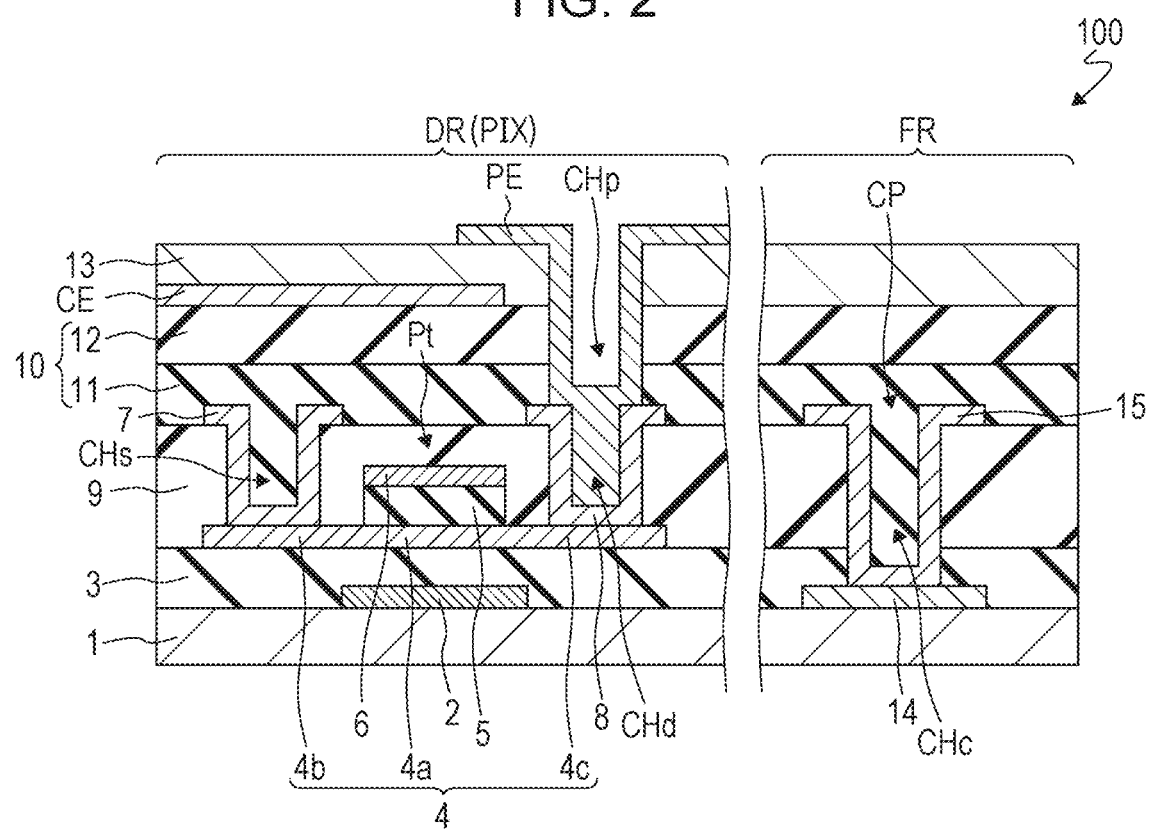
FIG. 2 is a sectional view schematically showing the active matrix board.

FIG. 2 is a sectional view schematically showing the active matrix board 100. In the left side of FIG. 2, a portion of the pixel regions PIX of the display region DR is shown. In the right side, a portion of the peripheral region FR is shown. The active matrix board 100 is used in, for example, an FFS-mode liquid crystal display apparatus.

As shown in FIG. 2, each of the pixel regions PIX includes a light-shielding layer 2, a corresponding one of the pixel TFTs (oxide semiconductor TFTs) Pt, a corresponding one of the pixel electrodes PE, and the common electrode CE.

The light-shielding layer 2 is placed on the substrate 1. The light-shielding layer 2 has conductivity. A lower insulating layer 3 is placed so as to cover the light-shielding layer 2.

Each pixel TFT Pt includes an oxide semiconductor layer 4, a gate insulating layer 5, a gate electrode (upper gate electrode) 6, a source electrode 7, and a drain electrode 8. The pixel TFT Pt has a top-gate structure.

The oxide semiconductor layer 4 is placed on the lower insulating layer 3. The oxide semiconductor layer 4 includes a channel region 4a, a source contact region 4b, and a drain contact region 4c. The channel region 4a overlaps the light-shielding layer 2 when viewed in a substrate surface normal direction. The source contact region 4b and the drain contact region 4c are located on both sides of the oxide semiconductor layer 4.

The gate insulating layer 5 is placed on the channel region 4a of the oxide semiconductor layer 4. The gate electrode 6 is placed on the gate insulating layer 5. A first interlayer insulating layer 9 is placed so as to cover the gate electrode 6 and the oxide semiconductor layer 4.

The source electrode 7 is connected to the source contact region 4b in a source contact hole CHs formed in the first interlayer insulating layer 9. The drain electrode 8 is connected to the drain contact region 4c in a drain contact hole CHd formed in the first interlayer insulating layer 9.

A second interlayer insulating layer 10 is placed so as to cover the pixel TFT Pt. As shown in FIG. 2, the second interlayer insulating layer 10 includes an inorganic insulating layer (passivation layer) 11 and an organic insulating layer (planarizing layer) 12 placed on the inorganic insulating layer 11.

The common electrode CE is placed on the second interlayer insulating layer 10. A dielectric layer 13 is placed so as to cover the common electrode CE.

Each pixel electrode PE is placed on the dielectric layer 13. The pixel electrode PE is connected to the drain electrode 8 of the pixel TFT Pt in a pixel contact hole CHp formed in the dielectric layer 13 and the second interlayer insulating layer 10. The pixel electrode PE has at least one slit (opening portion), which is not shown herein.

The peripheral region FR includes a connecting portion CP where a lower conductive layer 14 and an upper conductive layer 15 are connected to each other. The lower conductive layer 14 is formed from the same conductive film as the light-shielding layers 2. The upper conductive layer 15 is formed from the same conductive film as the source electrode 7 and the drain electrode 8. The upper conductive layer 15 is connected to the lower conductive layer 14 in a connecting portion contact hole CHc formed in the first interlayer insulating layer 9 and the lower insulating layer 3. The connecting portion CP is, for example, a terminal portion for electrically connecting the gate bus lines GL or the source bus lines SL to external wiring lines.

In the peripheral region FR, monolithically formed peripheral circuits, such as the gate drivers GD, are placed, which is not shown in FIG. 2. TFTs (referred to as "circuit TFTs") forming the peripheral circuits, as well as the pixel TFTs Pt, may be oxide semiconductor TFTs.

The active matrix board 100 is used in, for example, an FFS-mode or IPS-mode liquid crystal display apparatus. An FFS-mode is a transverse electric field mode in which a pair of electrodes are placed on a substrate and an electric field is applied to liquid crystal molecules in a direction (transverse direction) parallel to a surface of the substrate. In this example, the following electric field is produced: an electric field represented by electric lines of force that emanate from the pixel electrodes PE to pass through a liquid crystal layer (not shown) and that further pass through slit-shaped openings of the pixel electrodes PE to reach the common electrode CE. This electric field has components transverse to the liquid crystal layer. As a result, a transverse electric field can be applied to the liquid crystal layer. In the transverse electric field mode, no liquid crystal molecules rise from a substrate and therefore there is an advantage that a viewing angle wider than that in a vertical electric field mode can be achieved.

An electrode structure in which the pixel electrodes PE are placed above the common electrode CE with the dielectric layer 13 therebetween is disclosed in, for example, International Publication No. 2012/086513. Incidentally, the common electrode CE may be placed above the pixel electrodes PE with the dielectric layer 13 therebetween. Such an electrode structure is described in, for example, Japanese Unexamined Patent Application Publication No. 2008-032899 and Japanese Unexamined Patent Application Publication No. 2010-008758. For reference, the entire contents of International Publication No. 2012/086513, Japanese Unexamined Patent Application Publication No. 2008-032899, and Japanese Unexamined Patent Application Publication No. 2010-008758 are incorporated in the present specification.

A method for manufacturing the active matrix board 100 according to this embodiment is described with reference to FIGS. 3A to 9B. FIGS. 3A to 9B are process sectional views illustrating the method for manufacturing the active matrix board 100.

Figure 3A:
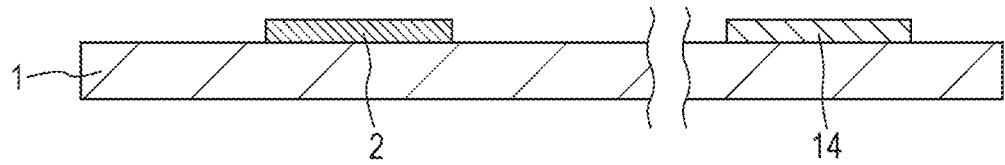
FIG. 3A is a process sectional view illustrating a manufacturing method according to an embodiment 1 of the disclosure.

First, as shown in FIG. 3A, the light-shielding layers 2 and the lower conductive layer 14 are formed on the substrate 1. In particular, the light-shielding layers 2 and the lower conductive layer 14 can be formed in such a manner that after a conductive film (a thickness of, for example, 50 nm to 500 nm) for light-shielding layers is formed on the substrate 1, which has insulating properties, by a sputtering process or the like, the conductive film is patterned.

As the substrate 1, for example, a glass substrate, a silicon substrate, a plastic substrate (resin substrate) having heat resistance, or the like can be used.

As the conductive film for light-shielding layers, for example, a metal film containing an element selected from aluminum (Al), chromium (Cr), copper (Cu), tantalum (Ta), titanium (Ti), molybdenum (Mo), and tungsten (W) or an alloy film containing these elements can be used. Alternatively, a multilayer film including a plurality of films of these may be used. The following film can be used: for example, a multilayer film having a three-layer structure consisting of a titanium film, an aluminum film, and a titanium film or a three-layer structure consisting of a molybdenum film, an aluminum film, and a molybdenum film. Incidentally, the conductive film for light-shielding layers is not limited to any three-layer structure and may have a single-layer structure, a two-layer structure, a multilayer structure composed of four or more layers. Herein, as the conductive film for light-shielding layers, a multilayer film including a Ti film (a thickness of 15-70 nm) which is a lower layer and a Cu film (a thickness of 200-400 nm) which is an upper layer is used.

Figure 3B:
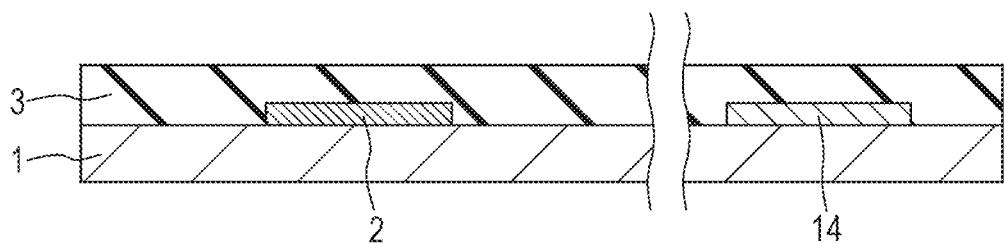
FIG. 3B is a process sectional view illustrating the manufacturing method according to the embodiment 1 of the disclosure.

Next, as shown in FIG. 3B, the lower insulating layer 3 (a thickness of, for example, 200 nm to 500 nm) is formed so as to cover the light-shielding layers 2 and the lower conductive layer 14.

As the lower insulating layer 3, a silicon oxide ($SiO_2$) layer, a silicon nitride (SiNx) layer, a silicon oxynitride (SiOxNy: x>y) layer, a silicon nitride oxide (SiNxOy: x>y) layer, an aluminum oxide layer, a tantalum oxide layer, or the like can be appropriately used. The lower insulating layer 3 may have a multilayer structure. Herein, the lower insulating layer 3 is formed by, for example, a CVD process so as to have a structure that forms a multilayer film including a silicon nitride (SiNx) layer (a thickness of 100-500 nm) which is a lower layer and a silicon oxide ($SiO_2$) layer (a thickness of 20-300 nm) which is an upper layer.

Subsequently, the oxide semiconductor layers 4, the gate insulating layers 5, and the gate electrodes 6 are formed on the lower insulating layer 3.

Figure 3C:
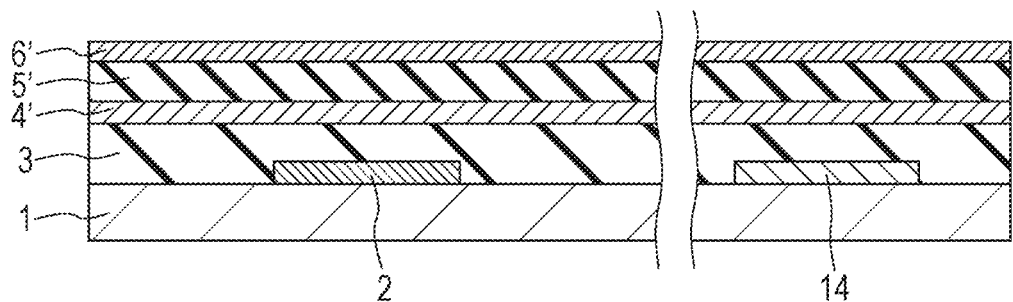
FIG. 3C is a process sectional view illustrating the manufacturing method according to the embodiment 1 of the disclosure.

In particular, as shown in FIG. 3C, an oxide semiconductor film 4' (a thickness of, for example, 15 nm to 200 nm), an insulating film 5' (a thickness of, for example, 80 nm to 250 nm), and a gate conductive film 6' (a thickness of, for example, 50 nm to 500 nm) are formed on the lower insulating layer 3 in that order. The oxide semiconductor film 4' and the gate conductive film 6' can be formed by, for example, a sputtering process. The insulating film 5' can be formed by, for example, a CVD process. The oxide semiconductor film 4', which is not particularly limited, is, for example, an In—Ga—Zn—O semiconductor film. As the insulating film 5', an insulating film (an insulating film exemplified as the gate insulating layers 5) similar to the lower insulating layer 3 can be used. As the gate conductive film 6', a conductive film similar to the conductive film for light-shielding layers can be used. Herein, for example, a silicon oxide ($SiO_2$) film is used as the insulating film 5' and a multilayer film including a Ti film (a thickness of 15-70 nm) which is a lower layer and a Cu film (a thickness of 200-400 nm) which is an upper layer is used as the gate conductive film 6'.

Figure 3D:
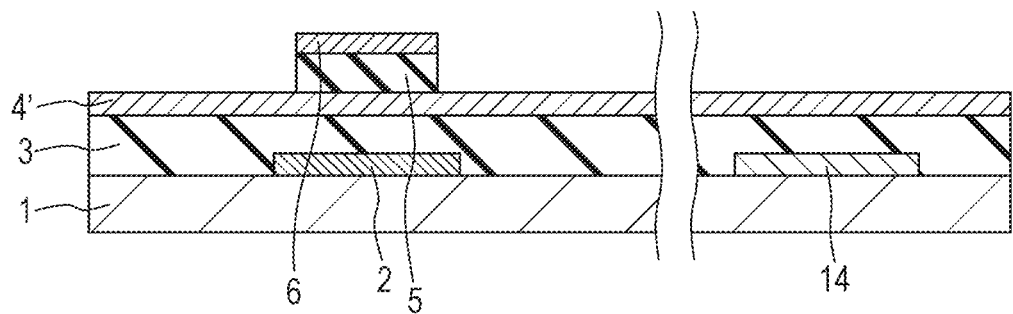
FIG. 3D is a process sectional view illustrating the manufacturing method according to the embodiment 1 of the disclosure.

Next, as shown in FIG. 3D, the formation of the gate electrodes 6 by patterning the gate conductive film 6' and the formation of the gate insulating layers 5 by patterning the insulating film 5' are performed in series. The gate conductive film 6' can be patterned by, for example, wet etching or dry etching. The insulating film 5' can be patterned by, for example, dry etching.

Figure 4A:
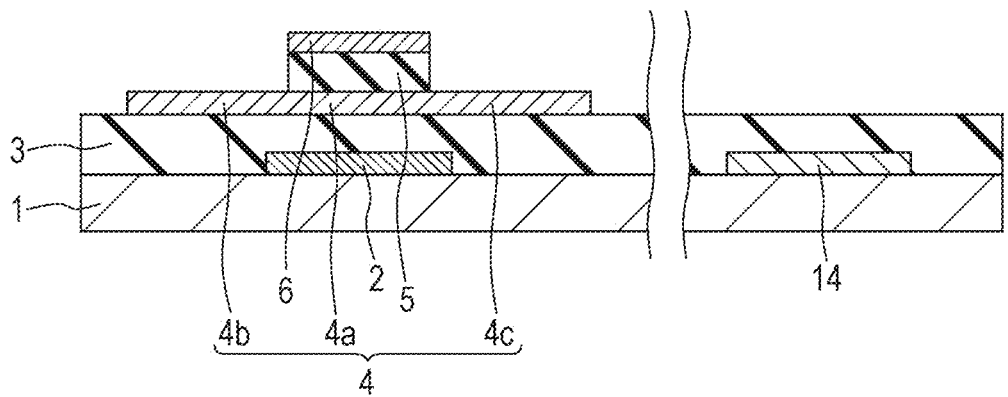
FIG. 4A is a process sectional view illustrating the manufacturing method according to the embodiment 1 of the disclosure.

Subsequently, as shown in FIG. 4A, the oxide semiconductor layers 4 are formed by patterning the oxide semiconductor film 4'. The oxide semiconductor film 4' can be patterned by, for example, wet etching. Thereafter, the oxide semiconductor layers 4 are subjected to a resistance-lowering treatment in such a manner that the gate electrodes 6 are used as a mask. The resistance-lowering treatment is, for example, a plasma treatment. This allows regions of the oxide semiconductor layers 4 that overlap none of the gate electrodes 6 and the gate insulating layers 5 to become low-resistance regions (the source contact regions 4b and the drain contact regions 4c) lower in resistivity than regions (the channel regions 4a) that overlap the gate electrodes 6 and the gate insulating layers 5.

Figure 4B:
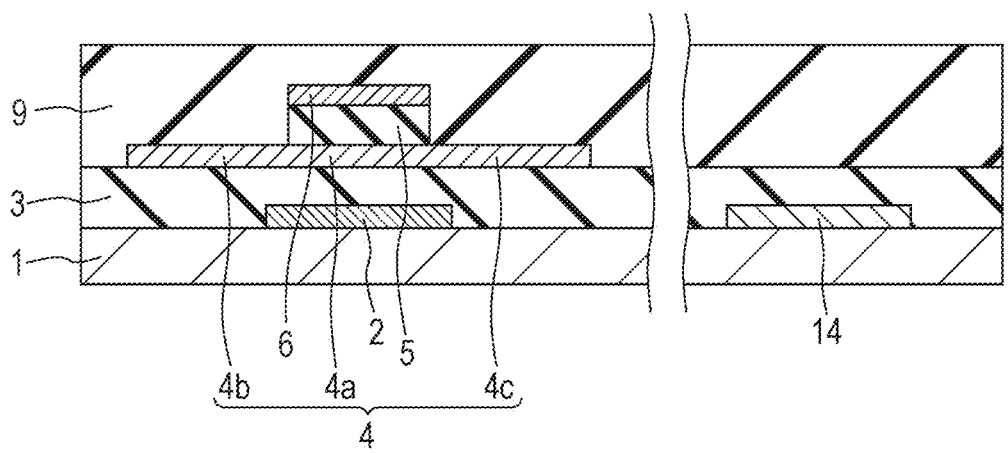
FIG. 4B is a process sectional view illustrating the manufacturing method according to the embodiment 1 of the disclosure.

Next, as shown in FIG. 4B, the first interlayer insulating layer 9 is formed so as to cover the oxide semiconductor layers 4, the gate insulating layers 5, and the gate electrodes 6. The thickness of the first interlayer insulating layer 9 is, for example, 100 nm to 500 nm. The first interlayer insulating layer 9 can be formed by depositing one or more of a silicon oxide film, a silicon nitride film, a silicon oxynitride film, and a silicon nitride oxide film. Herein, as the first interlayer insulating layer 9, for example, an SiNx layer (a thickness of 300 nm) is formed by a CVD process.

Figure 4C:
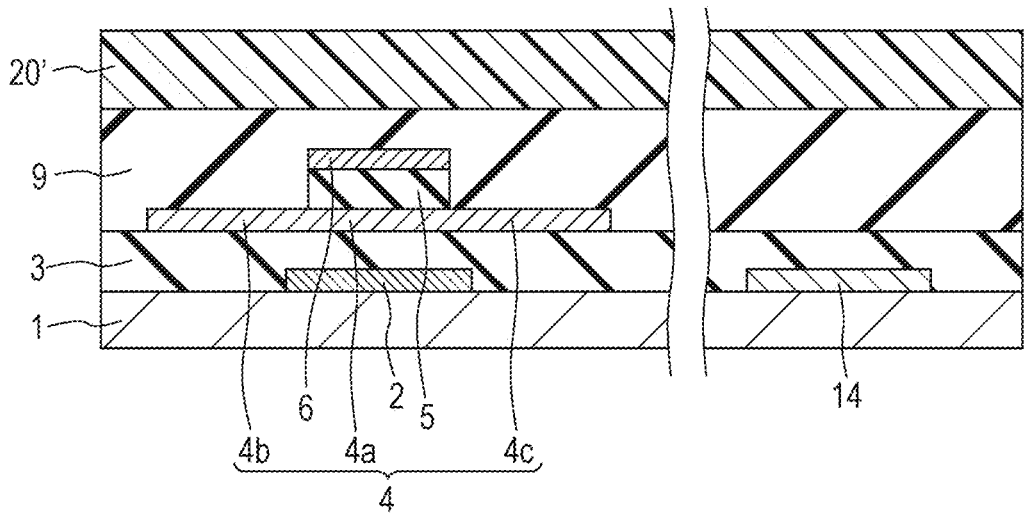
FIG. 4C is a process sectional view illustrating the manufacturing method according to the embodiment 1 of the disclosure.

Subsequently, the source contact holes CHs and the drain contact holes CHd are formed in the first interlayer insulating layer 9 such that a portion of the source contact region 4b of each oxide semiconductor layer 4 and a portion of the drain contact region 4c thereof are exposed. The connecting portion contact hole CHc is formed in the first interlayer insulating layer 9 and the lower insulating layer 3 such that a portion of the lower conductive layer 14 is exposed. In particular, as shown in FIG. 4C, a photoresist film 20' is formed on the first interlayer insulating layer 9.

Figure 5A:
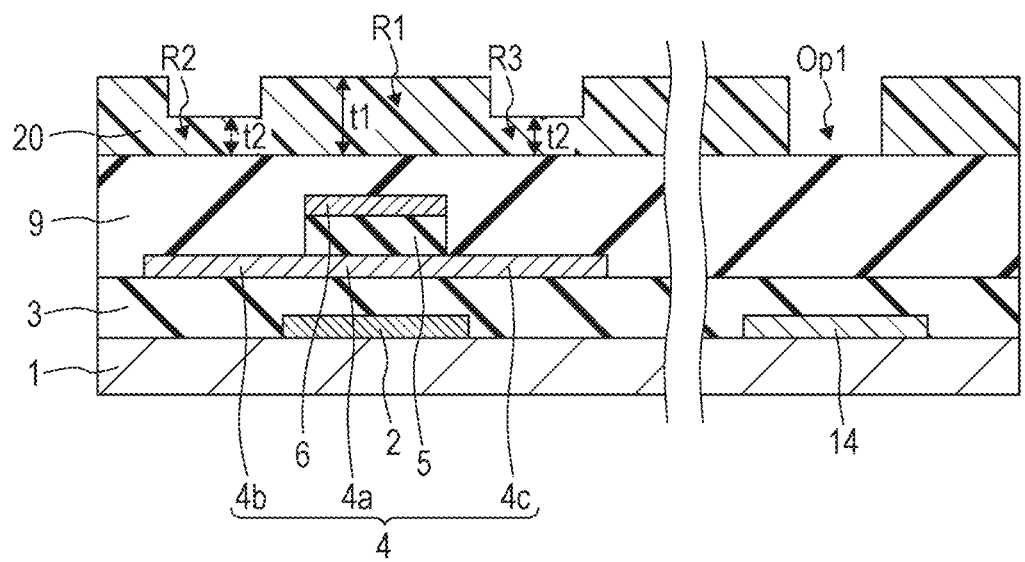
FIG. 5A is a process sectional view illustrating the manufacturing method according to the embodiment 1 of the disclosure.

Next, as shown in FIG. 5A, the photoresist film 20' is exposed to light using a multi-tone mask and is then developed, whereby a photoresist layer 20 is formed. The photoresist layer 20 includes first regions R1 having a first thickness t1, second regions R2 each of which overlaps a portion of a corresponding one of the source contact regions 4b, third regions R3 each of which overlaps a portion of a corresponding one of the drain contact regions 4c, the second regions R2 and the third regions R3 having a second thickness t2 less than the first thickness t1, and a first opening portion Op1 overlapping a portion of the lower conductive layer 14. As the multi-tone mask, in particular, a gray tone mask or a half-tone mask can be used. The gray tone mask is provided with a slit with a resolution not higher than that of an exposure system. Intermediate exposure is achieved by blocking a portion of light with the slit. On the other hand, in the half-tone mask, intermediate exposure is achieved by the use of a transflective film.

Figure 5B:
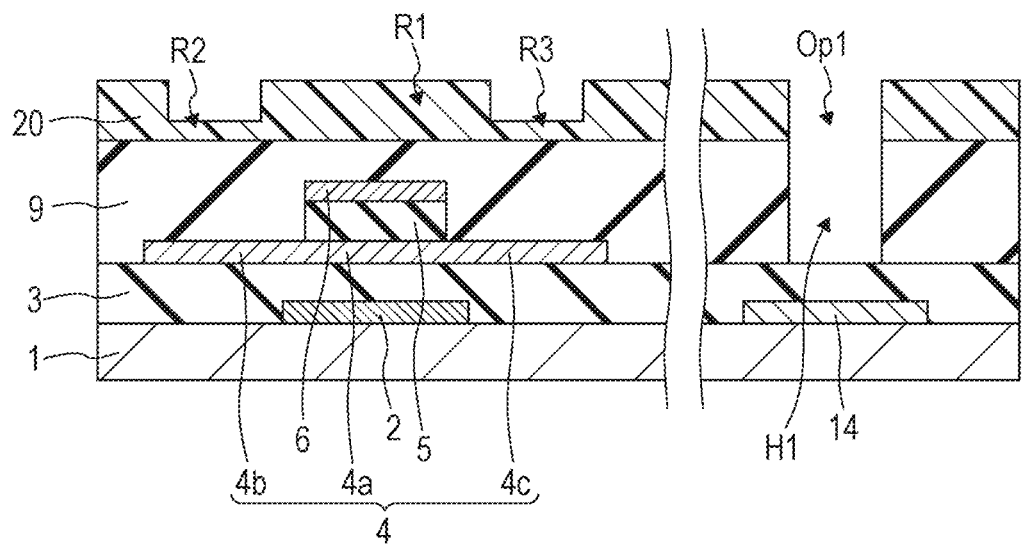
FIG. 5B is a process sectional view illustrating the manufacturing method according to the embodiment 1 of the disclosure.

Subsequently, as shown in FIG. 5B, a first hole H1 is formed in the first interlayer insulating layer 9 by etching (for example, dry etching) so as to extend from the first opening portion Op1 in the photoresist layer 20. The first hole H1 extends from the first opening portion Op1 to reach the upper surface of the lower insulating layer 3.

Figure 6A:
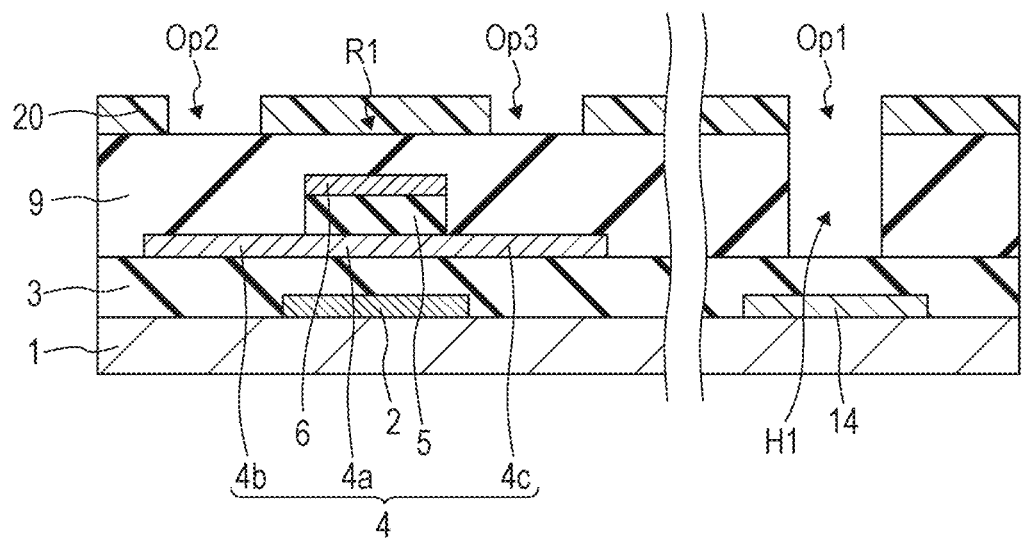
FIG. 6A is a process sectional view illustrating the manufacturing method according to the embodiment 1 of the disclosure.

Next, as shown in FIG. 6A, second opening portions Op2 and third opening portions Op3 are formed in the photoresist layer 20 by removing the second regions R2 and the third regions R3 from the photoresist layer 20. This step can be performed by, for example, ashing.

Figure 6B:
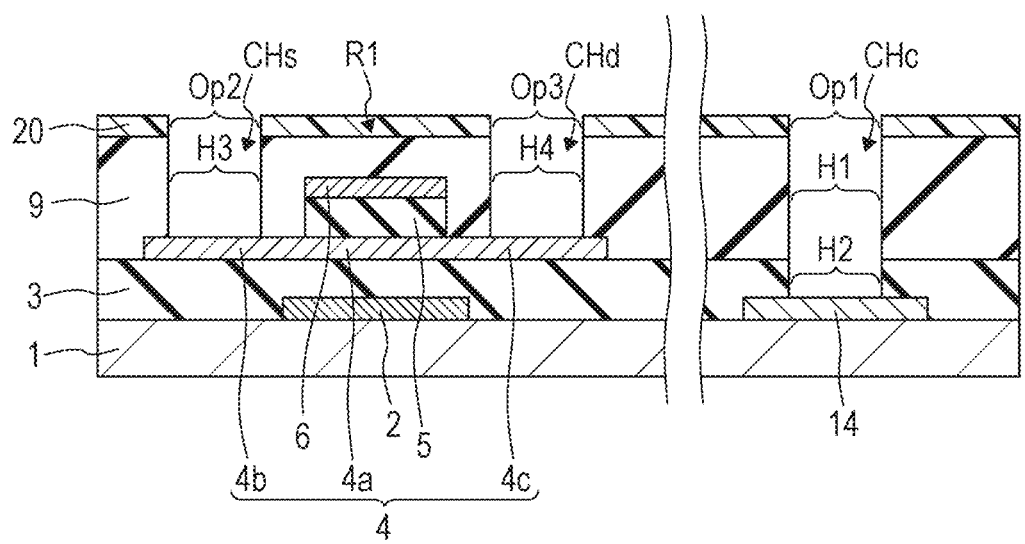
FIG. 6B is a process sectional view illustrating the manufacturing method according to the embodiment 1 of the disclosure.

Subsequently, as shown in FIG. 6B, a second hole H2 is formed in the lower insulating layer 3 by etching (for example, dry etching) so as to extend from the first hole H1 in the first interlayer insulating layer 9 and third holes H3 and fourth holes H4 in the first interlayer insulating layer 9 so as to extend from the second opening portions Op2 and the third opening portions Op3, respectively, in the photoresist layer 20. The second hole H2 extends from the first hole H1 in the first interlayer insulating layer 9 to reach the upper surface of the lower conductive layer 14. The third holes H3 extend from the second opening portions Op2 in the photoresist layer 20 to reach the upper surfaces of the source contact regions 4b of the oxide semiconductor layers 4. The fourth holes H4 extend from the third opening portions Op3 in the photoresist layer 20 to reach the upper surfaces of the drain contact regions 4c of the oxide semiconductor layers 4. Thereafter, the photoresist layer 20 is peeled off.

In this manner, the source contact holes CHs and the drain contact holes CHd are formed in the first interlayer insulating layer 9 and the connecting portion contact hole CHc can be formed in the first interlayer insulating layer 9 and the lower insulating layer 3.

Figure 7A:
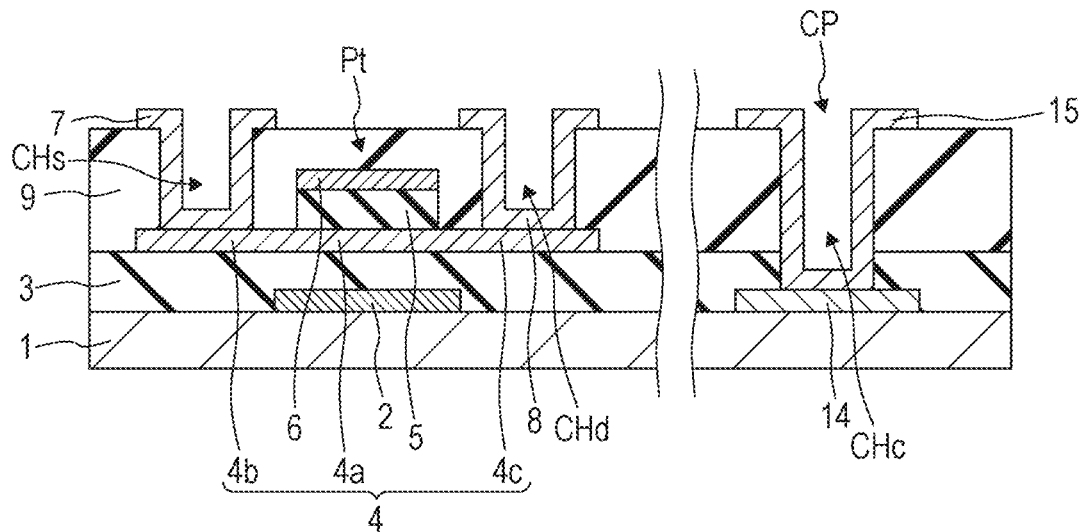
FIG. 7A is a process sectional view illustrating the manufacturing method according to the embodiment 1 of the disclosure.

Next, as shown in FIG. 7A, the source electrodes 7, the drain electrodes 8, and the upper conductive layer 15 are formed on the first interlayer insulating layer 9. In particular, the source electrodes 7, the drain electrodes 8, and the upper conductive layer 15 can be formed in such a manner that after a source conductive film (a thickness of, for example, 50 nm to 500 nm) is formed on the first interlayer insulating layer 9 and is also formed in the source contact holes CHs, the drain contact holes CHd, and the connecting portion contact hole CHc, the source conductive film is patterned. The source conductive film can be patterned by, for example, dry etching or wet etching. As the source conductive film, for example, an element selected from aluminum (Al), chromium (Cr), copper (Cu), tantalum (Ta), titanium (Ti), molybdenum (Mo), and tungsten (W) or an alloy containing these elements can be used. The source conductive film may have, for example, a three-layer structure consisting of a titanium film, an aluminum film, and a titanium film; a three-layer structure consisting of a molybdenum film, an aluminum film, and a molybdenum film; or the like. Incidentally, the source conductive film is not limited to any three-layer structure and may have a single-layer structure, a two-layer structure, a multilayer structure composed of four or more layers. Herein, a multilayer film including a Ti film (a thickness of 15-70 nm) which is a lower layer and a Cu film (a thickness of 200-400 nm) which is an upper layer is used.

Figure 7B:
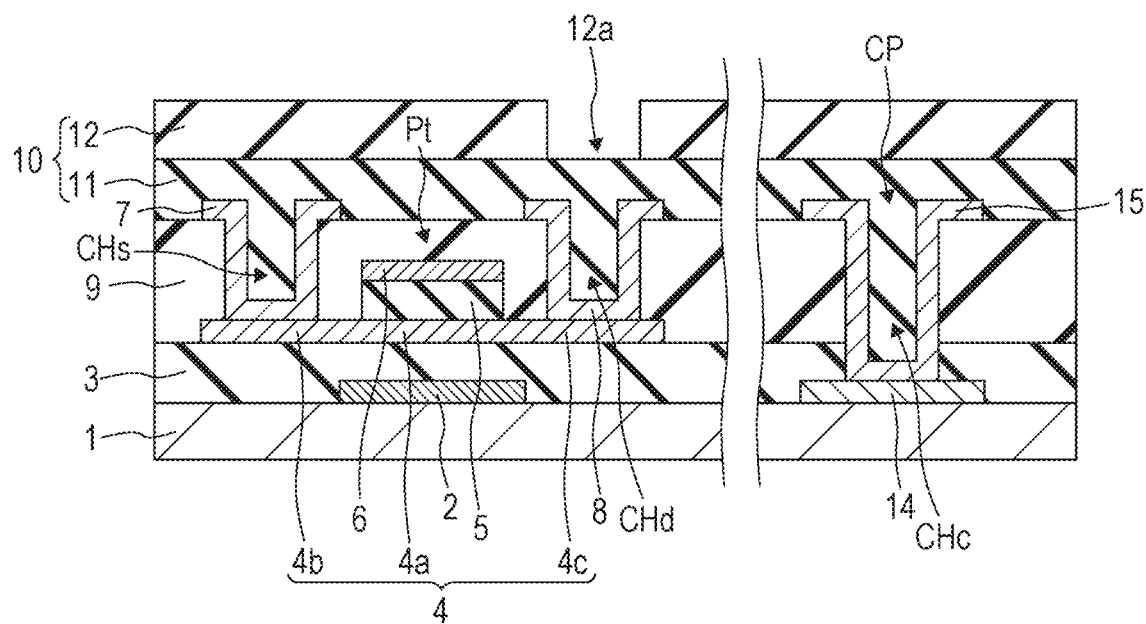
FIG. 7B is a process sectional view illustrating the manufacturing method according to the embodiment 1 of the disclosure.

Subsequently, as shown in FIG. 7B, the second interlayer insulating layer 10 is formed so as to cover the pixel TFTs Pt. In particular, the second interlayer insulating layer 10 is formed in such a manner that the inorganic insulating layer 11 (a thickness of, for example, 100 nm to 400 nm) and the organic insulating layer 12 (a thickness of, for example, 1-3 µm, preferably 2-3 µm) are formed in series. The organic insulating layer 12 is provided with opening portions 12a each of which overlaps at least one portion of a corresponding one of the drain electrodes 8. Material of the inorganic insulating layer 11 may be the same as material exemplified as material of the first interlayer insulating layer 9. Herein, as the inorganic insulating layer 11, an SiNx layer (a thickness of, for example, 200 nm) is formed by a CVD process. The organic insulating layer 12 is formed from, for example, a photosensitive resin material.

Figure 8A:
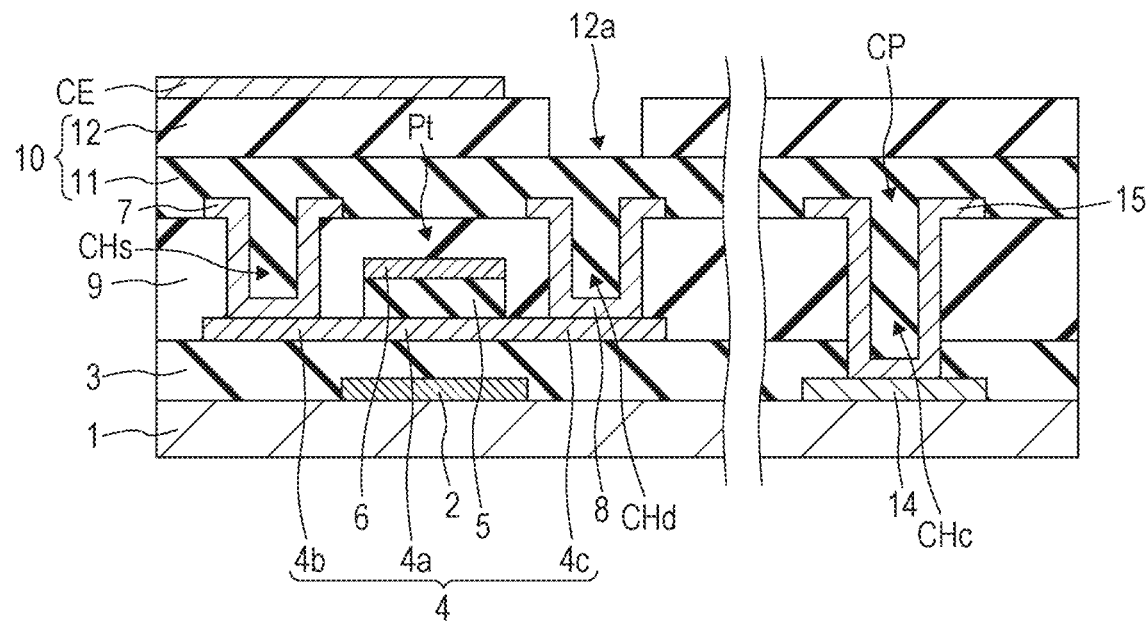
FIG. 8A is a process sectional view illustrating the manufacturing method according to the embodiment 1 of the disclosure.

Next, as shown in FIG. 8A, the common electrode CE is formed on the second interlayer insulating layer 10. In particular, the common electrode CE can be formed in such a manner that after a transparent conductive film (a thickness of 20-300 nm) is formed on the second interlayer insulating layer 10, the transparent conductive film is patterned. Herein, an indium-tin oxide film is formed as the transparent conductive film by, for example, a sputtering process, followed by patterning by wet etching. As material of the transparent conductive film, a metal oxide such as indium-tin oxide (ITO), indium-zinc oxide, or ZnO can be used.

Figure 8B:
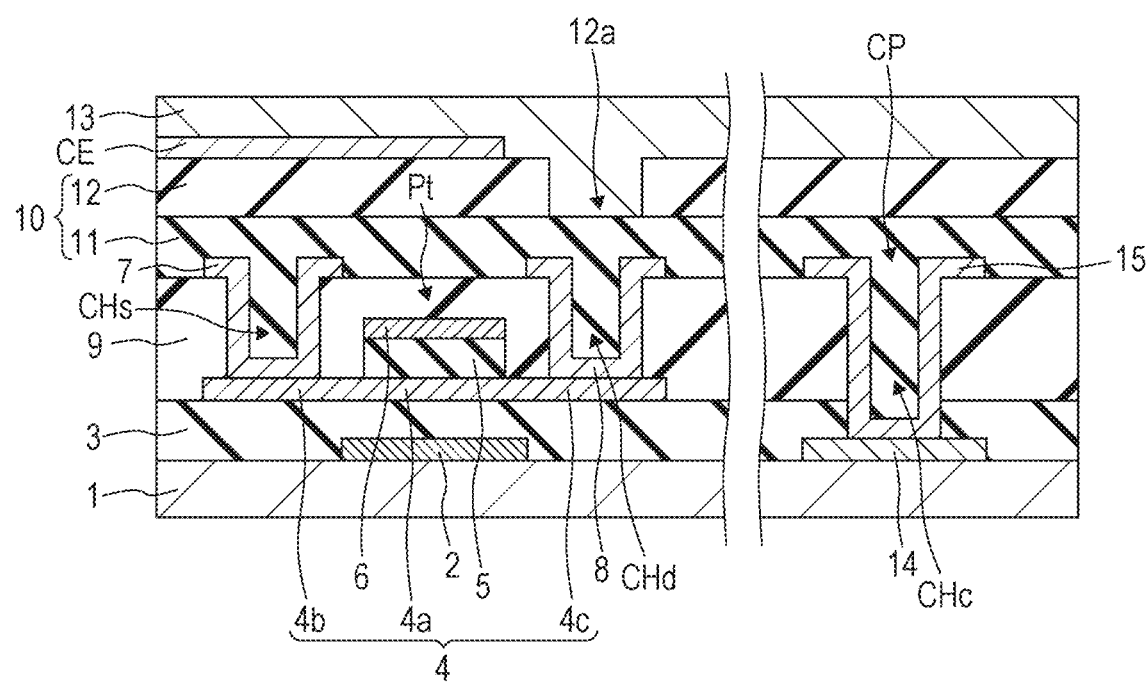
FIG. 8B is a process sectional view illustrating the manufacturing method according to the embodiment 1 of the disclosure.

Subsequently, as shown in FIG. 8B, the dielectric layer 13 (a thickness of 50-500 nm) is formed over the second interlayer insulating layer 10 and the common electrode CE. Material of the dielectric layer 13 may be the same as material exemplified as material of the first interlayer insulating layer 9. Herein, as the dielectric layer 13, for example, an SiN film is formed by a CVD process.

Figure 9A:
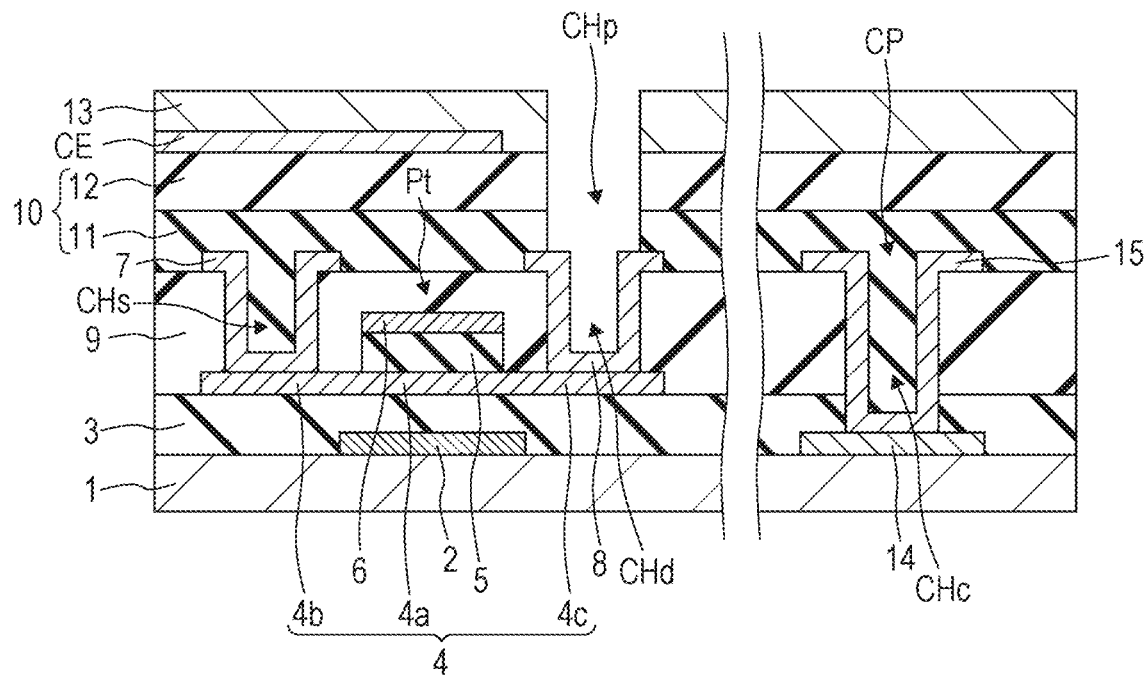
FIG. 9A is a process sectional view illustrating the manufacturing method according to the embodiment 1 of the disclosure.

Next, as shown in FIG. 9A, the pixel contact holes CHp are formed in the dielectric layer 13 and the inorganic insulating layer 11 such that a portion of each drain electrode 8 is exposed. The pixel contact holes CHp can be formed by, for example, dry etching.

Figure 9B:
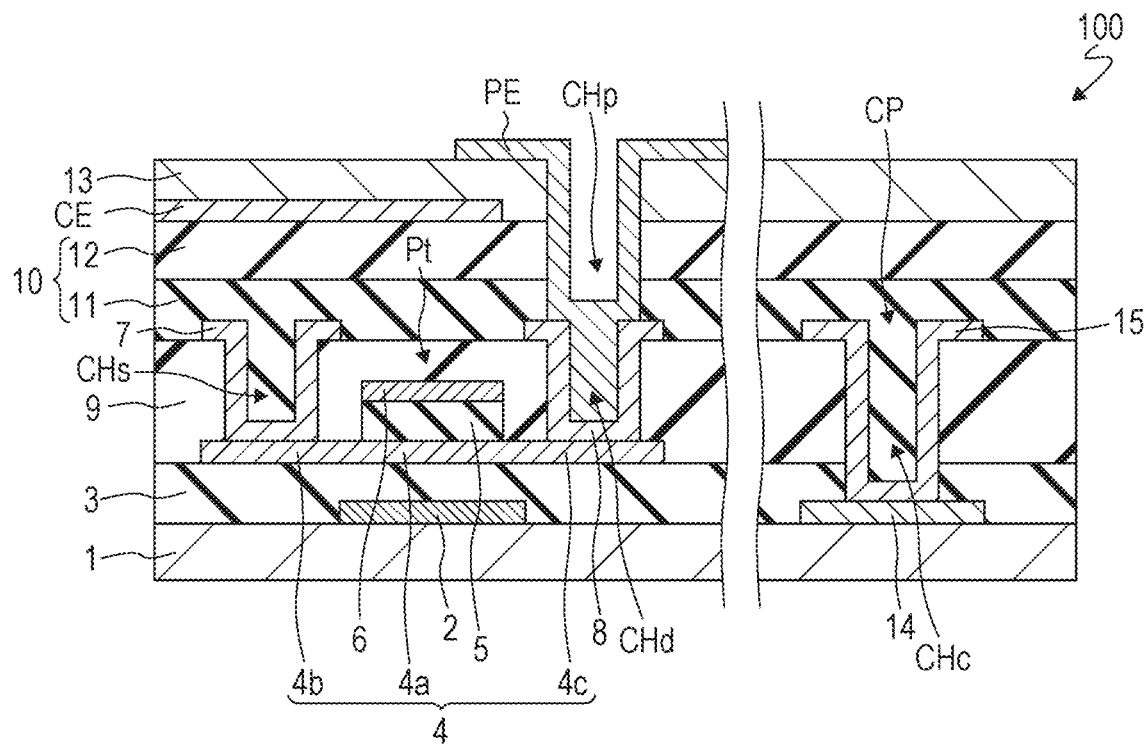
FIG. 9B is a process sectional view illustrating the manufacturing method according to the embodiment 1 of the disclosure.

Thereafter, as shown in FIG. 9B, the pixel electrodes PE (a thickness of 20-300 nm) are formed on the dielectric layer 13. In particular, the pixel electrodes PE are formed in such a manner that after a transparent conductive film is formed on the dielectric layer 13, the transparent conductive film is patterned. Material of the transparent conductive film for the pixel electrodes PE may be the same as material exemplified as material of the transparent conductive film for common electrode CE. Herein, an indium-tin oxide film is formed as the transparent conductive film by a sputtering process, followed by patterning by wet etching.

In this manner, the active matrix board 100 can be obtained.

About Effects of Manufacturing Method According to Embodiment 1 of Disclosure

Effects of a manufacturing method according to the embodiment 1 of the disclosure are described below in comparison with a manufacturing method of a reference example.

FIGS. 10A to 11B are schematic process sectional views illustrating the manufacturing method of the reference example.

Figure 10A:
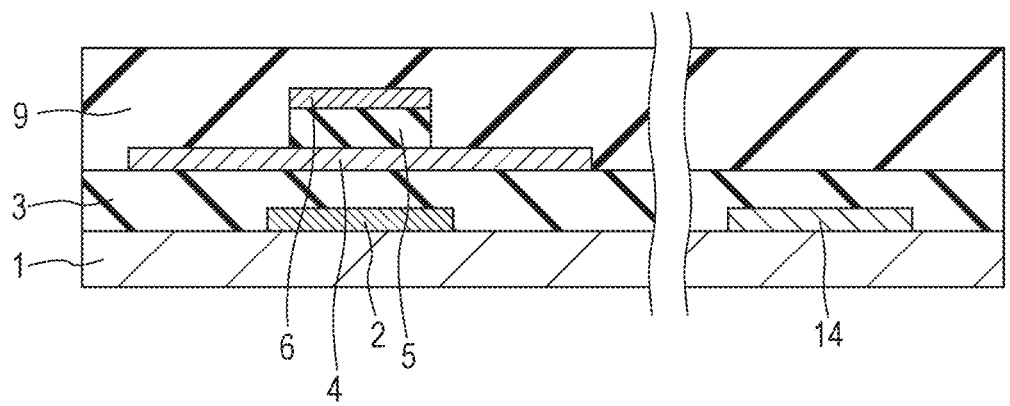
FIG. 10A is a process sectional view illustrating a manufacturing method of a reference example.
Figure 10B:
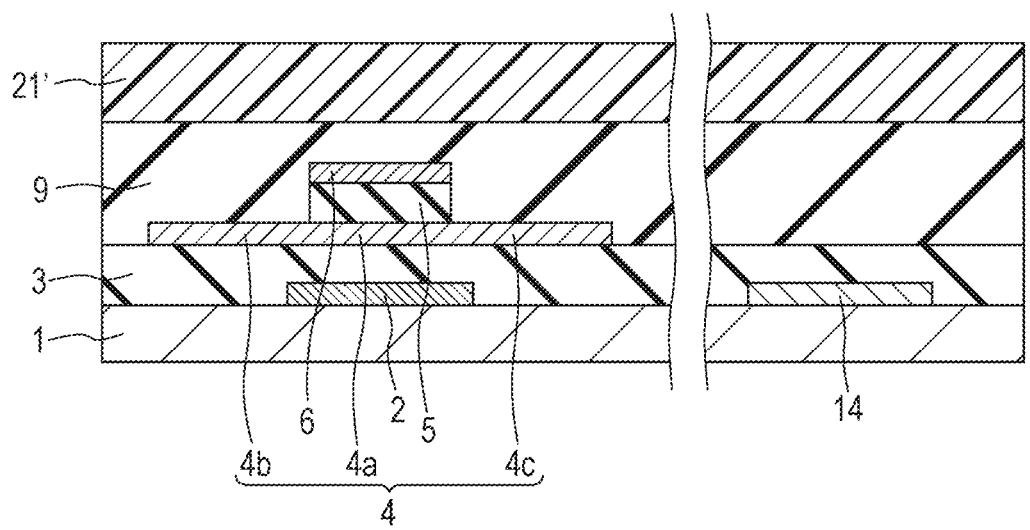
FIG. 10B is a process sectional view illustrating the manufacturing method of the reference example.

In the manufacturing method of the reference example, first, as shown in FIG. 10A, light-shielding layers 2, a lower conductive layer 14, a lower insulating layer 3, oxide semiconductor layers 4, gate insulating layers 5, gate electrodes 6, and a first interlayer insulating layer 9 are formed on a substrate 1. This step can be performed by the methods described with reference to FIGS. 3A to 4B. Next, as shown in FIG. 10B, a photoresist film 21' is formed on the first interlayer insulating layer 9.

Figure 11A:
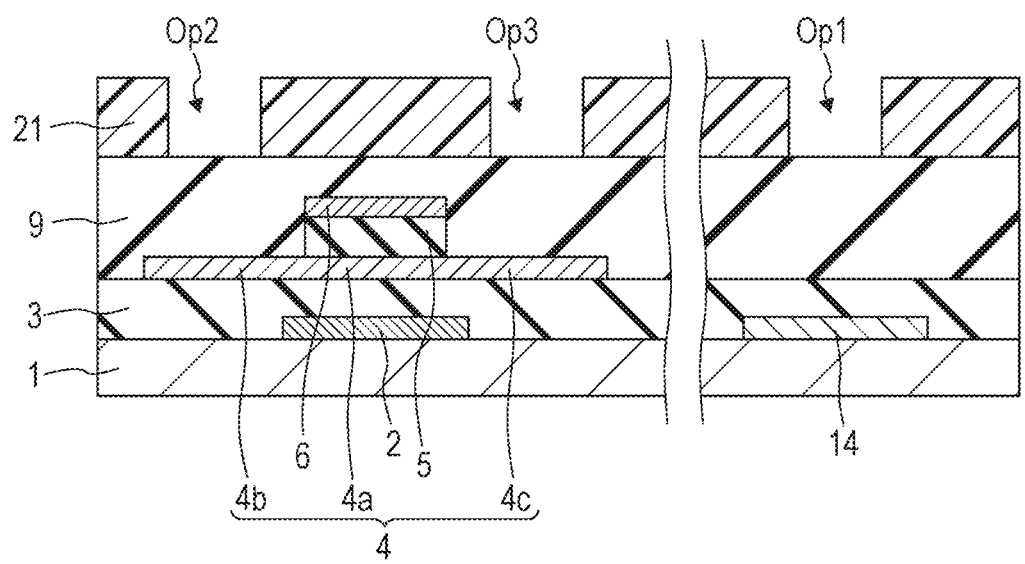
FIG. 11A is a process sectional view illustrating the manufacturing method of the reference example.

Subsequently, as shown in FIG. 11A, the photoresist film 21' is exposed to light using a photomask and is then developed, whereby a photoresist layer 21 is formed. The photomask used herein is not a multi-tone mask but is a general binary mask. The obtained photoresist layer 21 has an first opening portion Op1 overlapping a portion of the lower conductive layer 14, second opening portions Op2 each of which overlaps a portion of a corresponding one of source contact regions 4b, and third opening portions Op3 each of which overlaps a portion of a corresponding one of drain contact regions 4c.

Figure 11B:
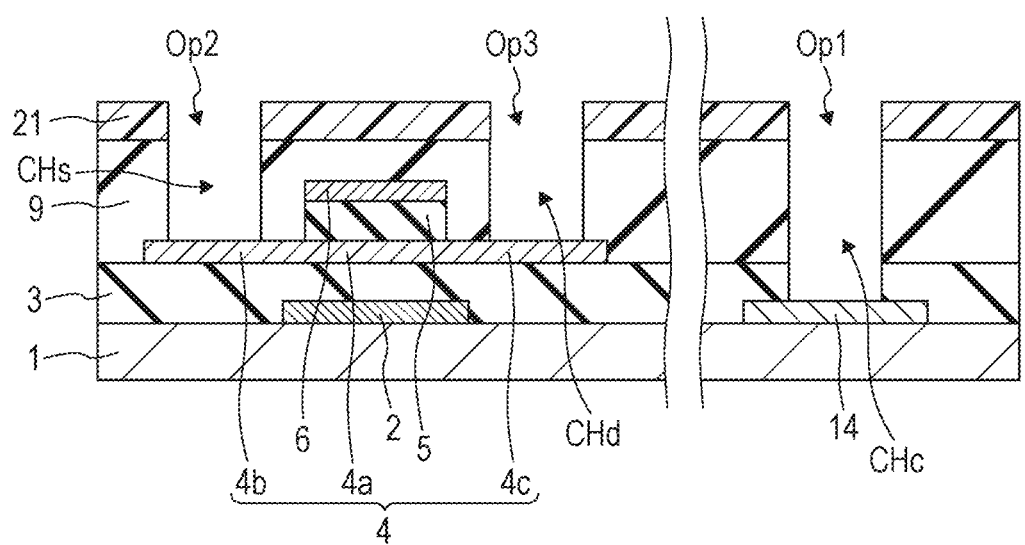
FIG. 11B is a process sectional view illustrating the manufacturing method of the reference example.

Next, as shown in FIG. 11B, source contact holes CHs and drain contact holes CHd are formed in the first interlayer insulating layer 9 by etching and a connecting portion contact hole CHc is formed in the first interlayer insulating layer 9 and the lower insulating layer 3 by etching.

Thereafter, the photoresist layer 21 is peeled off and source electrodes 7, drain electrodes 8, an upper conductive layer 15, a second interlayer insulating layer 10, a common electrode CE, a dielectric layer 13, and pixel electrodes PE are formed by the methods described with reference to FIGS. 7A to 10B.

Figure 12:
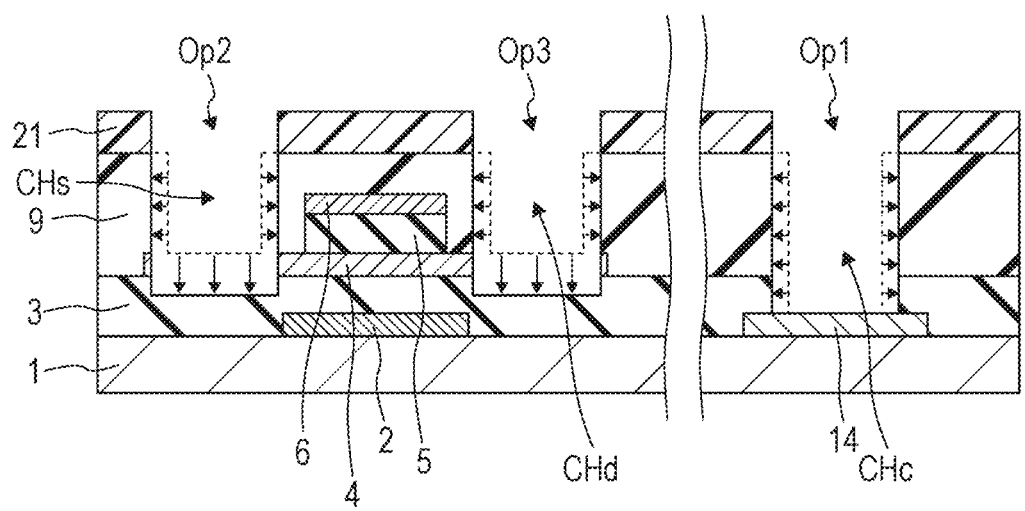
FIG. 12 is a view illustrating a problem occurring in the manufacturing method of the reference example.

In the manufacturing method of the reference example, when the connecting portion contact hole CHc is formed, the lower insulating layer 3 and the first interlayer insulating layer 9 are collectively etched; hence, the etching time is long. Therefore, as schematically shown in FIG. 12, the size of contact holes (the source contact holes CHs, the drain contact holes CHd, and the connecting portion contact hole CHc) is large, leading to difficulty in design. In each pixel PIX, the oxide semiconductor layer 4 functions as an etching stopper for the lower insulating layer 3. When the oxide semiconductor layer 4 is not sufficient to withstand etching, the lower insulating layer 3 is etched as shown in FIG. 12. The over-etching of the lower insulating layer 3 causes a reduction in reliability.

However, in the manufacturing method according to the embodiment 1 of the disclosure, the multi-tone mask is used in a step of forming the source contact holes CHs, the drain contact holes CHd, and the connecting portion contact hole CHs, whereby the photoresist layer 20 is formed so as to include the first regions R1; the second regions R2, which are thinner than the first regions R1; the third regions R3, which are thinner than the first regions R1; and the first opening portion Op1. This avoids the necessity of collectively etching the first interlayer insulating layer 9 and the lower insulating layer 3 as already described; hence, the increase in size of the contact holes (the source contact holes CHs, the drain contact holes CHd, and the connecting portion contact hole CHc) can be inhibited. Since there is no necessity to use the oxide semiconductor layers 4 as an etching stopper for the lower insulating layer 3 during collective etching, the lower insulating layer 3 is inhibited from being etched and the reduction of reliability due to the over-etching of the lower insulating layer 3 can be suppressed. Furthermore, since there is no necessity to collectively etch the first interlayer insulating layer 9 and the lower insulating layer 3, each of the first interlayer insulating layer 9 and the lower insulating layer 3 can be more thickly formed as compared to the manufacturing method of the reference example. Thickly forming the first interlayer insulating layer 9 and the lower insulating layer 3 enables the yield to be increased.

[About Potential Applied to Light-Shielding Layers 2]

The light-shielding layers 2, which have conductivity, may be in an electrically floating state (floating) or may be supplied with a predetermined potential. Supplying the light-shielding layers 2 with a predetermined potential (fixed potential) enables TFT characteristics of the pixel TFTs Pt to be enhanced. The light-shielding layers 2 may be supplied with substantially the same potential as that of the gate electrodes (upper gate electrodes) 6 so as to function as lower gate electrodes. That is, the pixel TFTs Pt may have a double-gate structure.

Embodiment 2

A manufacturing method according to an embodiment 2 is outlined with reference to FIGS. 13A to 14B. FIGS. 13A to 14B are process sectional views illustrating the manufacturing method according to the embodiment 2. In description below, the manufacturing method according to the embodiment 2 is described with a focus on differences from the manufacturing method according to Embodiment 1.

Figure 13A:
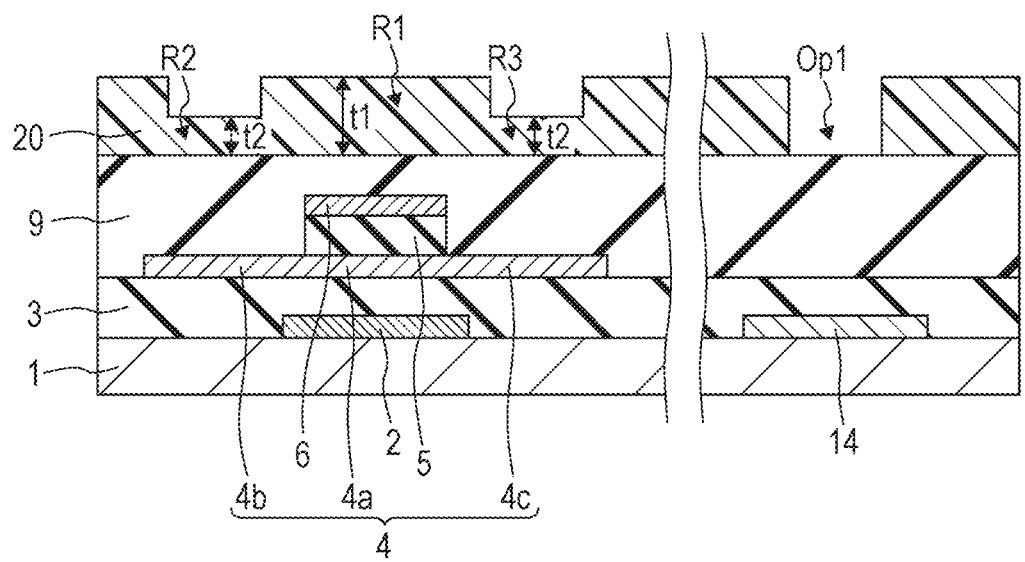
FIG. 13A is a process sectional view illustrating a manufacturing method according to an embodiment 2 of the disclosure.

First, as shown in FIG. 13A, light-shielding layers 2, a lower conductive layer 14, a lower insulating layer 3, oxide semiconductor layers 4, gate insulating layers 5, gate electrodes 6, and a first interlayer insulating layer 9 are formed on a substrate 1 and, furthermore, a photoresist layer 20 having first regions R1, second regions R2, third regions R3, and a first opening portion Op1 is formed on the first interlayer insulating layer 9. This step can be performed by the methods described with reference to FIGS. 3A to 5A. That is, a multi-tone mask is used to form the photoresist layer 20.

Figure 13B:
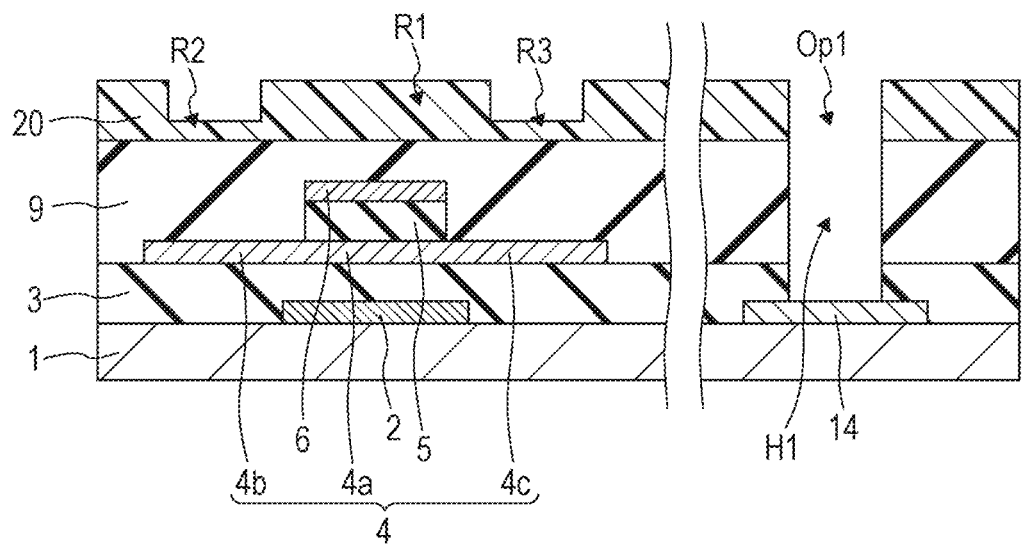
FIG. 13B is a process sectional view illustrating the manufacturing method according to the embodiment 2 of the disclosure.

Next, as shown in FIG. 13B, a first hole H1 is formed in the first interlayer insulating layer 9 and the lower insulating layer 3 by etching (for example, dry etching) so as to extend from the first opening portion Op1 in the photoresist layer 20. The first hole H1 extends from the first opening portion Op1 to reach the upper surface of the lower conductive layer 14.

Figure 14A:
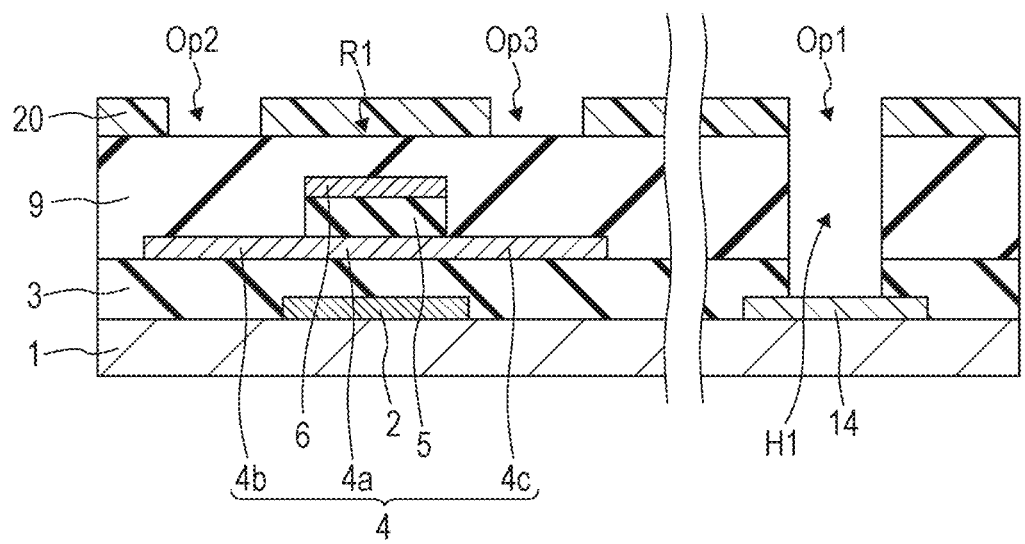
FIG. 14A is a process sectional view illustrating the manufacturing method according to the embodiment 2 of the disclosure.

Next, as shown in FIG. 14A, second opening portions Op2 and third opening portions Op3 are formed in the photoresist layer 20 by removing the second regions R2 and the third regions R3 from the photoresist layer 20. This step can be performed by, for example, ashing.

Figure 14B:
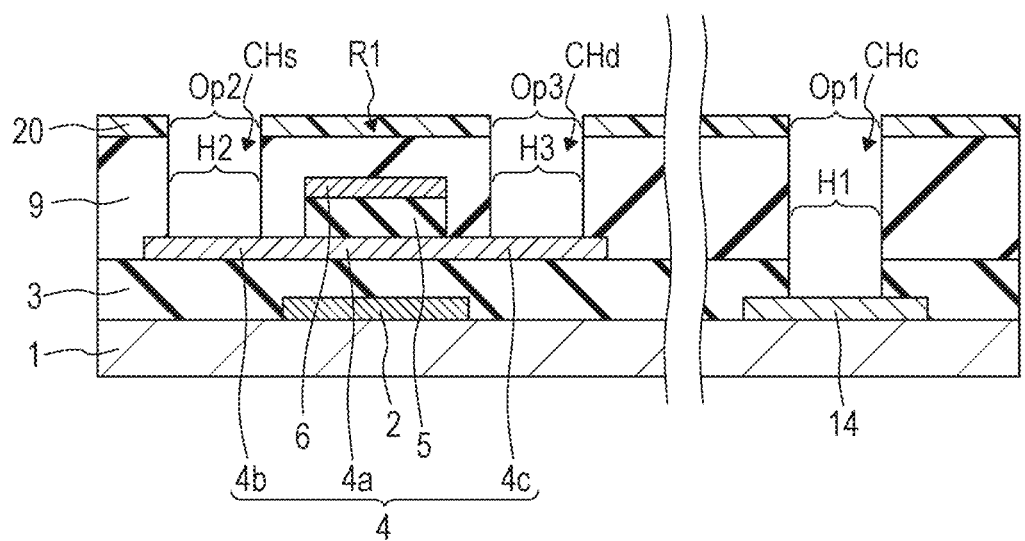
FIG. 14B is a process sectional view illustrating the manufacturing method according to the embodiment 2 of the disclosure.

Subsequently, as shown in FIG. 14B, second holes H2 and third holes H3 are formed in the first interlayer insulating layer 9 by etching (for example, dry etching) so as to extend from the second opening portions Op2 and the third opening portions Op3, respectively, in the photoresist layer 20. The second holes H2 extend from the second opening portions Op2 in the photoresist layer 20 to reach the upper surfaces of source contact regions 4*b* of the oxide semiconductor layers 4. The third holes H3 extend from the Third opening portions Op3 in the photoresist layer 20 to reach the upper surfaces of drain contact regions 4*c* of the oxide semiconductor layers 4. Thereafter, the photoresist layer 20 is peeled off.

In this manner, source contact holes CHs and drain contact holes CHd are formed in the first interlayer insulating layer 9 and a connecting portion contact hole CHc can be formed in the first interlayer insulating layer 9 and the lower insulating layer 3.

Thereafter, source electrodes 7, drain electrodes 8, an upper conductive layer 15, a second interlayer insulating layer 10, a common electrode CE, a dielectric layer 13, and pixel electrodes PE are formed by the methods described with reference to FIGS. 7A to 10B, whereby an active matrix board 100 is obtained.

The manufacturing method according to this embodiment differs from the manufacturing method according to Embodiment 1 in that the first interlayer insulating layer 9 and the lower insulating layer 3 are collectively etched when the connecting portion contact hole CHc is formed. When the first interlayer insulating layer 9 and the lower insulating layer 3 are collectively etched, the photoresist layer 20 is provided with none of the second opening portions Op2 and the third opening portions Op3 (that is, the second regions R2 and the third regions R3 are present); hence, unlike the manufacturing method of the reference example, the oxide semiconductor layers 4 is not used as an etching stopper for the first interlayer insulating layer 9. Thus, the lower insulating layer 3 can be inhibited from being etched when the oxide semiconductor layers 4 are not sufficient to withstand etching. Therefore, the reduction of reliability due to the over-etching of the lower insulating layer 3 can be suppressed.

Incidentally, in the manufacturing method according to this embodiment, etching for forming the source contact holes CHs (second holes H2) and the drain contact holes CHd (third holes H3) is carried out in such a state that the lower conductive layer 14 is exposed (FIG. 14B). Therefore, damage to the lower conductive layer 14 is concerned. Thus, from the viewpoint of causing no damage to the lower conductive layer 14, it can be said that the manufacturing method according to this embodiment is desirable.

[About Oxide Semiconductor]

In all the above-mentioned embodiments, an oxide semiconductor may be an amorphous oxide semiconductor or a crystalline oxide semiconductor having a crystalline portion. Examples of the crystalline oxide semiconductor include polycrystalline oxide semiconductors, microcrystalline oxide semiconductors, and crystalline oxide semiconductors having a c-axis substantially oriented perpendicularly to a layer surface.

An oxide semiconductor layer may have a multilayer structure composed of two or more layers. When the oxide semiconductor layer has the multilayer structure, the oxide semiconductor layer may include a non-crystalline oxide semiconductor layer and a crystalline oxide semiconductor layer. Alternatively, the oxide semiconductor layer may include a plurality of crystalline oxide semiconductor layers having different crystal structures. The oxide semiconductor layer may include a plurality of non-crystalline oxide semiconductor layers. When the oxide semiconductor layer has a two-layer structure including an upper layer and a lower layer, the energy gap of an oxide semiconductor contained in a layer (a lower layer in a case of a bottom-gate structure or an upper layer in a case of a top-gate structure) of the two layers that is located on the gate electrode side may be less than the energy gap of an oxide semiconductor contained in a layer (an upper layer in a case of the bottom-gate structure or layer in a case of the top-gate structure) located opposite to a gate electrode. However, when the difference in energy gap between these layers is relatively small, the energy gap of the oxide semiconductor contained in the layer located on the gate electrode side may be larger than the energy gap of the oxide semiconductor contained in the layer located opposite to the gate electrode.

Materials of non-crystalline oxide semiconductors and the above crystalline oxide semiconductors, structures thereof, film formation methods, the configuration of an oxide semiconductor layer having a multilayer structure, and the like are described in, for example, Japanese Unexamined Patent Application Publication No. 2014-007399. For reference, the entire contents of Japanese Unexamined Patent Application Publication No. 2014-007399 are incorporated in the present specification.

The oxide semiconductor layer may contain, for example, at least one metal element of In, Ga, and Zn. In this embodiment, the oxide semiconductor layer contains, for example, an In—Ga—Zn—O semiconductor (for example, indium gallium zinc oxide). Herein, the In—Ga—Zn—O semiconductor is a ternary oxide of In (indium), Ga (gallium), and Zn (zinc), where the proportion (composition ratio) between In, Ga, and Zn is not particularly limited and includes, for example, In:Ga:Zn=2:2:1, In:Ga:Zn=1:1:1, In:Ga:Zn=1:1:2, and the like. The oxide semiconductor layer can be formed from an oxide semiconductor film containing the In—Ga—Zn—O semiconductor. Incidentally, a channel-etched TFT including an active layer containing an oxide semiconductor, such as the In—Ga—Zn—O semiconductor, is referred to as a "CE-OS-TFT" in some cases.

The In—Ga—Zn—O semiconductor may be amorphous or crystalline. A crystalline In—Ga—Zn—O semiconductor is preferably a crystalline In—Ga—Zn—O semiconductor having a c-axis substantially oriented perpendicularly to a layer surface.

Incidentally, the crystal structure of the crystalline In—Ga—Zn—O semiconductor is disclosed in, for example, above-mentioned Japanese Unexamined Patent Application Publication No. 2014-007399, Japanese Unexamined Patent Application Publication No. 2012-134475, Japanese Unexamined Patent Application Publication No. 2014-209727, and the like. For reference, the entire contents of Japanese Unexamined Patent Application Publication No. 2012-134475 and Japanese Unexamined Patent Application Publication No. 2014-209727 are incorporated in the present specification. TFTs including an In—Ga—Zn—O semiconductor layer have high mobility (more than 20 times higher as compared to a-Si TFTs) and a low leakage current (less than one-hundredth of that of a-Si TFTs) and therefore are successfully used as driving TFTs (for example, TFTs included in a driving circuit which is located around a display region including a plurality of pixels and which is placed on the same substrate as the display region) and pixel TFTs (TFTs placed in pixels).

The oxide semiconductor layer may contain another oxide semiconductor instead of the In—Ga—Zn—O semiconductor. The oxide semiconductor layer may contain, for example, an In—Sn—Zn—O semiconductor (for example, In2O3-SnO2-ZnO: InSnZnO). The In—Sn—Zn—O semiconductor is a ternary oxide of In (indium), Sn (tin), and Zn (zinc). Alternatively, the oxide semiconductor layer may contain an In—Al—Zn—O semiconductor, an In—Al—Sn—Zn—O semiconductor, a Zn—O semiconductor, an In—Zn—O semiconductor, a Zn—Ti—O semiconductor, a Cd—Ge—O semiconductor, a Cd—Pb—O semiconductor, CdO (cadmium oxide), an Mg—Zn—O semiconductor, an In—Ga—Sn—O semiconductor, an In—Ga—O semiconductor, a Zr—In—Zn—O semiconductor, an Hf—In—Zn—O semiconductor, an Al—Ga—Zn—O semiconductor, or a Ga—Zn—O semiconductor.

According to an embodiment of the disclosure, a method successfully used to manufacture an active matrix board including an oxide semiconductor TFT including an upper gate electrode and a channel light-shielding layer can be provided.

The invention claimed is:

1. A method for manufacturing an active matrix board including
a display region including a plurality of pixel regions, a peripheral region located around the display region,
a substrate, and oxide semiconductor TFTs which are supported with the substrate and each of which is placed in a corresponding one of the pixel regions,
each of the pixel regions including
a light-shielding layer which is placed on the substrate and which has conductivity;
a lower insulating layer covering the light-shielding layer;
an oxide semiconductor layer which is placed on the lower insulating layer, which includes a channel region overlapping the light-shielding layer when viewed in a substrate surface normal direction, and which also includes a source contact region and drain contact region located on both sides of the oxide semiconductor layer;
a gate insulating layer placed on the channel region of the oxide semiconductor layer;
a gate electrode placed on the gate insulating layer;
an interlayer insulating layer covering the gate electrode and the oxide semiconductor layer;
a source electrode; and a drain electrode, the source electrode and the drain electrode being connected to the source contact region and the drain contact region, respectively, in a source contact hole and drain contact hole, respectively, formed in the interlayer insulating layer, the peripheral region including
a lower conductive layer formed from the same conductive film as the light-shielding layer and
an upper conductive layer formed from the same conductive film as the source electrode and the drain electrode, the upper conductive layer being connected to the lower conductive layer in a connecting portion contact hole formed in the interlayer insulating layer and the lower insulating layer, the method comprising:

(A) a step of forming the light-shielding layer and the lower conductive layer on the substrate;
(B) a step of forming the lower insulating layer such that the lower insulating layer covers the light-shielding layer and the lower conductive layer;
(C) a step of forming the oxide semiconductor layer, the gate insulating layer, and the gate electrode on the lower insulating layer;
(D) a step of forming the interlayer insulating layer such that the interlayer insulating layer covers the gate electrode and the oxide semiconductor layer;
(E) a step of forming the source contact hole and the drain contact hole in the interlayer insulating layer such that a portion of the source contact region of the oxide semiconductor layer and a portion of the drain contact region thereof are exposed and forming the connecting portion contact hole in the interlayer insulating layer and the lower insulating layer such that a portion of the lower conductive layer is exposed; and
(F) a step of forming the source electrode, the drain electrode, and the upper conductive layer on the interlayer insulating layer,
the step (E) including
(e-1) a step of forming a photoresist film on the interlayer insulating layer and
(e-2) a step of forming a photoresist layer in such a manner that the photoresist film is exposed to light using a multi-tone mask and is then developed,
the photoresist layer including
a first region having a first thickness,
a second region which has a second thickness less than the first thickness and which overlaps a portion of the source contact region, a third region which has the second thickness and which overlaps a portion of the drain contact region, and
a first opening portion overlapping the portion of the lower conductive layer.

2. The method for manufacturing the active matrix board according to claim 1, wherein the step (E) further including (e-3) a step of forming a first hole in the interlayer insulating layer by etching after the step (e-2) such that the first hole extends from the first opening portion in the photoresist layer,
(e-4) a step of forming a second opening portion and a third opening portion in the photoresist layer by removing the second region and the third region, respectively, from the photoresist layer after the step (e-3), and
(e-5) a step of forming a second hole in the lower insulating layer by etching after the step (e-4) such that the second hole extends from the first hole in the interlayer insulating layer and forming a third hole and a fourth hole in the interlayer insulating layer by etching such that the third hole and the fourth hole extend from the second opening portion and the third opening portion, respectively, in the photoresist layer.

3. The method for manufacturing the active matrix board according to claim 1, wherein the step (E) further including (e-3) a step of forming a first hole in the interlayer insulating layer and the lower insulating layer by etching after the step (e-2) such that the first hole extends from the first opening portion in the photoresist layer,
(e-4) a step of forming a second opening portion and a third opening portion in the photoresist layer by removing the second region and the third region, respectively, from the photoresist layer after the step (e-3), and
(e-5) a step of forming a second hole and a third hole in the interlayer insulating layer by etching after the step (e-4) such that the second hole and the third hole extend from the second opening portion and the third opening portion, respectively, in the photoresist layer.

4. The method for manufacturing the active matrix board according to claim 2, wherein the step (e-4) is performed by ashing.

5. The method for manufacturing the active matrix board according to claim 1, wherein the light-shielding layer is supplied with substantially the same potential as that of the gate electrode.

6. The method for manufacturing the active matrix board according to claim 1, wherein the oxide semiconductor layer contains an In—Ga—Zn—O semiconductor.

7. The method for manufacturing the active matrix board according to claim 6, wherein the In—Ga—Zn—O semiconductor includes a crystalline portion.

* * * * *